United States Patent [15] 3,667,063
Boyd et al. [45] May 30, 1972

[54] DIFFERENTIAL AMPLIFIER CIRCUIT

[72] Inventors: William Richard Boyd, Lafayette; Robert C. Franklin, Los Gatos, both of Calif.
[73] Assignee: Beckman Instruments, Inc.

[22] Filed: Apr. 27, 1970
[21] Appl. No.: 32,147

[52] U.S. Cl. ....................................330/2, 330/30 D, 330/35
[51] Int. Cl. ..........................................................H03f 19/00
[58] Field of Search........................................324/130; 330/9

[56] References Cited

UNITED STATES PATENTS 3,370,242 2/1968 Offner ........................................330/9
3,509,460 4/1970 Mizrahi..............................324/130 X
3,516,002 6/1970 Hillis......................................330/9 X

*Primary Examiner*—Nathan Kaufman
*Attorney*—Fowler, Knobbe & Martens and Robert J. Steinmeyer

[57] ABSTRACT

An electronic circuit for balancing a differential amplifier by periodically equalizing the inputs of the amplifier and monitoring the output of the amplifier with equalized inputs. The output of the amplifier is then used to balance the amplifier by changing the current in one leg of the differential amplifier circuit until the output level correctly indicates the equalized inputs.

16 Claims, 2 Drawing Figures

INVENTORS.
WILLIAM R. BOYD
ROBERT C. FRANKLIN
BY
FOWLER, KNOBBE
& MARTENS
ATTORNEYS.

DIFFERENTIAL AMPLIFIER CIRCUIT

BACKGROUND OF THE INVENTION

This invention relates to differential amplifier circuits, and more particularly, to circuits designed to balance the gain in the two legs of a differential amplifier circuit.

Differential amplifiers are used to monitor and amplify the instantaneous difference between the current or voltage level of two input signals. In order to accurately measure this difference in level, the monitoring and amplification circuits which are applied to each of the inputs must be balanced so that, when the input levels are equal, the output level correctly indicates the balanced input condition. Prior art differential amplifier circuits were typically balanced by manually adjusting the components in each of the amplification circuits so that the amplification factors were identical. This balancing was done in a static condition before the differential amplifier was placed operation, and circuit elements were often included to reduce the effects of temperature changes and changes in input levels upon the amplification factor of each of the amplifying circuits. However, regardless of the care that was taken to balance the circuit components and to make allowances for changes caused by temperature changes and signal level changes, such amplifiers required occasional adjustments to maintain their balanced condition. Even with this maintenance, these circuits were susceptible to short term variations in amplification due to short term thermal or signal level conditions which would imbalance the circuits.

BRIEF DESCRIPTION OF INVENTION

The present invention comprises a circuit which is periodically balanced to assure equalization of the amplification factors in each leg of the differential amplifier, as the amplifier is being used. The system requires an interruption in the normal use of the amplifier on a periodic basis, during which interruptions the input to each of the amplifiers is set at a predetermined level. The output of the differential amplifier is then monitored to determine whether an imbalance exists in the circuit. Balancing circuitry responsive to the output of the differential amplifier is then used to change the impedance in one leg of the differential amplifier to bring the differential amplifier into a balanced condition. Since this process is repeated periodically, and since the corrections made in the impedance of the differential amplifier are maintained during the period between successive balancing operations, the differential amplifier is maintained in a balanced condition regardless of short or long term changes in the amplification factors of the components in the different legs of the differential amplifier.

The advantages of the present invention are best described in reference to the drawings in which:

FIG. 1 is a schematic representation of the differential amplifier and balancing circuit of the present invention, and FIG. 2 is a functional block diagram of the differential amplifier shown schematically in FIG. 1.

DETAILED DESCRIPTION OF INVENTION

Figure 1:
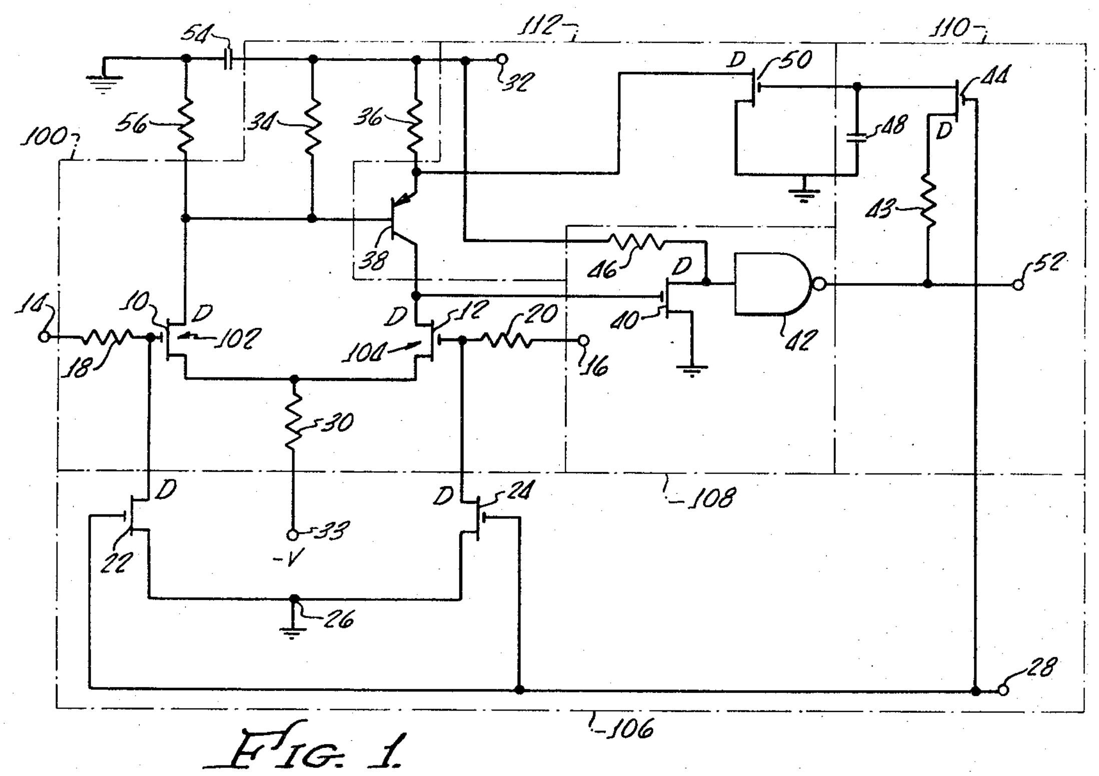

The functional operation of the circuit of FIG. 1 will first be explained in reference to the block diagram of FIG. 2. This block diagram includes a differential amplifier 100 which includes a pair of amplifying elements 102 and 104, which are connected to respective input leads 14 and 16, and serve to limit the current between a power supply at point 32 and a power supply at point 33 through the respective branches of the differential amplifier 100. Connected to each branch of this differential amplifier is a clock 106 which periodically changes the input of each of the amplifying elements 102 and 104 to a predetermined known value while at the same time blanking the input signals at points 14 and 16. It is during this interval that the differential amplifier 100 is balanced.

Connected to one branch of the differential amplifier, i.e., the branch with the amplifying element 104, is an error sensing means 108. This error sensing means 108 monitors the signal level in this one branch of the differential amplifier, which signal level, during the period when the differential amplifier has a predetermined input level, should have a known value. If the amplifying elements 102 and 104 are not balanced the input level to the error sensing means 108 will be above or below this known value, and the error sensing means 108 produces an output error signal representative of this balancing error within the differential amplifier.

The error signal from the sensing means 108 is coupled to an error averaging means 110. The output from the clock 106 is likewise connected to the error averaging means 110, and functions to limit the error averaging means 110 to monitor the output from the error sensing means 108 only during those periods when the clock 106 is presenting a predetermined input to the differential amplifier 100. The error averaging means comprises an energy storage device, the energy level of which is altered by a small amount during each pulse of the clock 106, in response to the instantaneous output from the error sensing means. This error averaging means therefore produces an output signal which is representative of the sum of the error signals from the error sensing means over a period of time which is long in comparison with the period of the clock 106, and which is representative only of the error signals occurring during those periods when the differential amplifier 100 has a predetermined input level. The error averaging means drives a gain altering means 112, which serves to limit the current through one branch of the differential amplifier 100, in this case the branch containing the amplifying element 104, by an amount dependent upon the output of the error averaging means 110. This gain altering means 112 will therefore decrease the current through the amplifying element 104 if the output of the error averaging means 110 indicates that an imbalance exists in the differential amplifier 100 caused by a surplus of current through the amplifying element 104, during the periods when a predetermined input to the differential amplifier 100 is supplied from the clock 106. Similarly, the gain altering means 112 will allow increased current to flow through the amplifying element 104 if the predetermined-input imbalance of the differential amplifier 100 is caused by a shortage of current through the amplifying element 104. The diagram of FIG. 2 therefore shows a closed-loop feedback system which presents the differential amplifier 100 with a predetermined input for a short interval and at a rate determined by the frequency of the clock 106. During this predetermined-input period, the balance of the differential amplifier 100 is monitored by comparing in an error sensing means 108 the signal level in one branch of the differential amplifier 100 with the level which that branch of the differential amplifier 100 would have if the differential amplifier 100 were balanced. The error produced by the sensing means 108 is then averaged and utilized to change the signal level in one branch of the differential amplifier 100 to return the differential amplifier 100 to a balanced condition.

Figure 2:
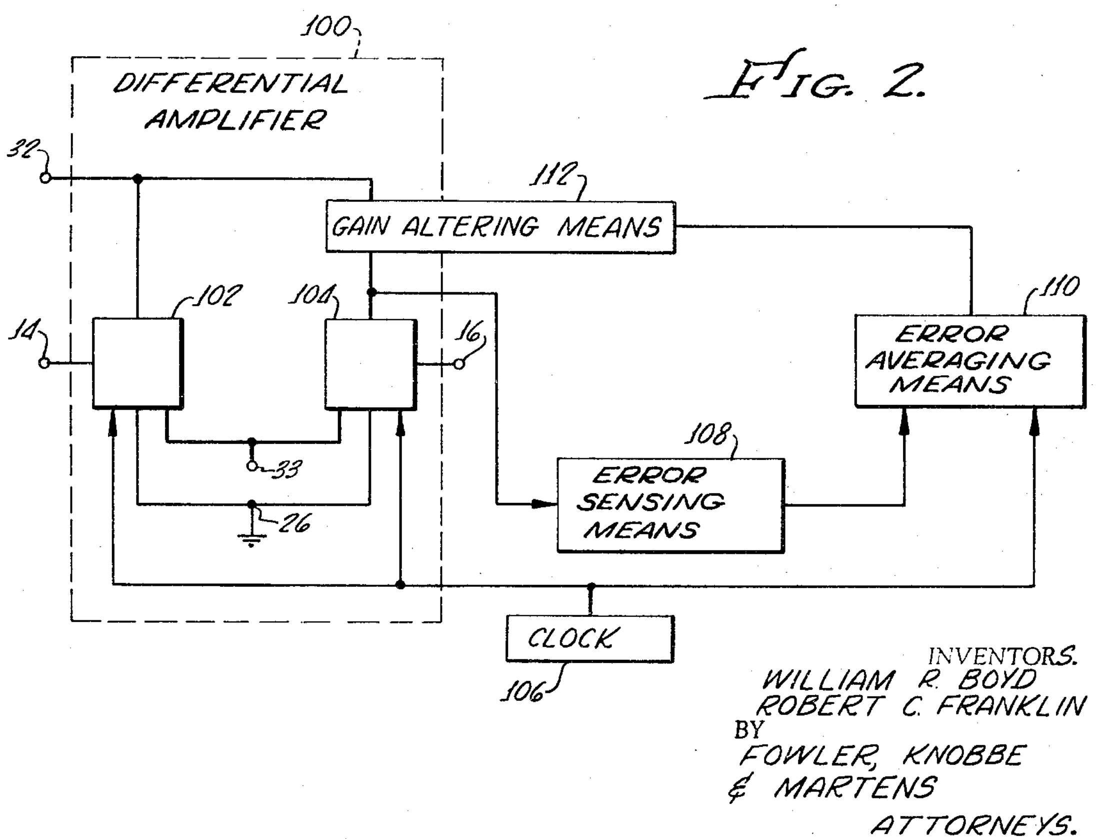

With this understanding of the overall functional characteristics of the major elements of the circuit as shown in FIG. 2, the function of the various elements in the schematic of FIG. 1 will now be explained. The basic differential amplifier 100 includes a first branch comprising a load resistor 34 which connects the drain of a field effect transistor 10 to a positive power supply voltage at point 32, and a negative power supply voltage at point 33 which is connected to the source of the transistor 10 through a resistor 30. This branch corresponds to the amplifying element 102 of FIG. 2. The other branch of the differential amplifier comprises a load resistor 36 coupling the drain of a field effect transistor 12 to the power supply at point 32, and a connection between the negative power supply at point 33 and the source of the transistor 12 through the resistor 30, this leg corresponding to the amplifying element 104 in FIG. 2. The present invention is adapted to balance differential amplifiers composed of amplifying elements other than field effect transistors. However, field effect transistors, although particularly adapted to circuits requiring high input impedance, are very susceptible to balancing problems, since their transconductance characteristics vary more radically from one device to the next, and from one shipment to the next, than in the case of many other semiconductors.

A clock pulse is connected to the circuit at point 28. It has been found advantageous to utilize a clock which has a relatively short duty cycle and which has a frequency of 120 CPS. This clock signal drives the inputs to the field effect transistors 10 and 12 to a predetermined level in the following manner: The gate electrodes of these field effect transistors 10 and 12 are respectively connected to the inputs 14 and 16 of the differential amplifier through the input resistors 18 and 20. These gate electrodes are likewise connected to the drain electrode of a respective one of another pair of field effect transistors 22 and 24, each of which has its source electrode connected to ground at a point 26 and its gate electrode connected to the clock pulse at point 28, this clock pulse determining the times at which these transistors 22 and 24 are conductive. The field effect transistors 22 and 24 have a high impedance when the waveform of the clock signal at point 28 is at its quiescent or ground level, and therefore, the inputs to the field effect transistors 10 and 12 are determined solely by the inputs presented at the points 14 and 16. However, when the clock pulse rises to a positive level, the field effect transistors 22 and 24 are driven to conduction, and the gate electrodes of the field effect transistors 10 and 12 are therefore shunted to the ground point 26. The predetermined input of the field effect transistors 10 and 12, in this preferred embodiment, is therefore ground level. Therefore, for a short period of time once every 1/120 of a second, the input to each branch of the differential amplifier is grounded. It is during this period that the balance of the differential amplifier is monitored, and corrections are made to the current through one leg of the differential amplifier.

The error sensing means 108 of the preferred embodiment of the present invention includes a voltage sensing means including a field effect transistor 40, and a DTL logic gate 42. The drain electrode of the field effect transistor 12 is connected to the gate electrode of the field effect transistor 40. This field effect transistor 40 functions as a voltage threshold device, having its source electrode connected to ground and its drain electrode connected through the resistor 46 to the power supply 32. The input to the DTL logic gate 42, which is also connected to the drain electrode of the transistor 40, will therefore be at ground level if the FET transistor 40 is conductive but will be at the voltage level of the power supply 32 if the FET transistor 40 is nonconductive. The DTL logic gate 42 switches between two predetermined output levels, i.e., the levels of the power supply 32 and ground, in accordance with the voltage at the drain electrode of the FET transistor 40. The bias of the FET transistor 40 is adjusted such that, when the differential amplifier is in a balanced condition and the inputs to the FET transistors 10 and 12 are grounded, the DTL logic gate 42 is at its threshold switching level. Therefore, if the voltage on the gate electrode of the FET transistor 40 becomes more positive than the balanced level, the FET transistor 40 will become more conductive, and the potential on the drain electrode of the FET transistor 40 will become more negative, causing the DTL logic gate 42 to switch to its positive voltage output. If the voltage on the gate electrode of the FET transistor 40 becomes more negative than the balanced level, the FET transistor 40 will become less conductive and the drain electrode will therefore become more positive than the threshold level of the DTL logic gate 42, causing this gate 42 to swing to its zero voltage output level. This combination of the field effect transistor 40 and the logic gate 42 therefore operates as a voltage threshold detector, the state of logic gate 42 being dependent upon the voltage at the drain of the field effect transistor 12.

The output signal from the gate 42, corresponding to the output of the error sensing means 108, is connected to the error averaging means 110, which includes a current limiting resistor 43, a field effect transistor 44, and a capacitor 48. The field effect transistor 44 has its gate electrode connected to the same clock signal at point 28 which serves to ground the input to the differential amplifier, and its source-drain circuit series connected with the capacitor 48 and the resistor 43. Therefore, during each clock pulse of the clock signal at point 28, the field effect transistor 44 is driven to conduction and the voltage level at the output of the DTL logic gate 42 is connected to conduct current into or away from the capacitor 48 through the resistor 43. If the output of the DTL logic gate 42 is at its positive value, it will charge the capacitor 48 a small amount through the resistor 43 during each clock pulse, this amount dependent upon the value of the capacitor 48, the resistor 43 and the pulse duration of the clock at point 28. If, however, the output of the gate 42 is at ground level, it will discharge the capacitor 48 a small amount during each clock pulse. The current level through the gate 42 is small, so that, during each clock pulse, the capacitor 48 will be charged by only a relatively small amount, and the charge level of the capacitor 48 is therefore dependent upon the sum of the error signals which occur during the clock pulses at the output of the gate 42 over a period of time which is long in comparison with the period of the clock at point 28.

The charge level of the capacitor 48 is used to drive the gain altering means 112, which includes a field effect transistor 50 and a transistor 38. The transistor 38 has its collector/emitter circuit series connected between the field effect transistor 12 and the load resistor 36 of the amplifying element 104. The base electrode of this transistor 38 is connected to the junction between the drain electrode of the field effect transistor 10 and the load resistor 34 of the amplifying element 102. The drain electrode of the field effect transistor 50 is connected to the emitter of the transistor 38, the source electrode is connected to ground, and the gate electrode is connected to the capacitor 48. As the capacitor 48 is charged by the gate 42 through the field effect transistor 44 and resistor 43, the voltage level on the capacitor 48 will become more positive, making the field effect transistor 50 more conductive. When the field effect transistor 50 becomes more conductive, an increased amount of current will flow from the emitter of the transistor 38 to ground, and the voltage level of the emitter of the transistor 38 is therefore made more negative. Since, as indicated before, a voltage level on the capacitor 48 is more negative than the balanced voltage level indicates that the collector electrode of the transistor 38 was more positive than it should be in the balanced condition, this current bleed through the field effect transistor 50 will serve to lower the conduction level through the emitter/collector circuit of the transistor 38 by lowering the potential across the circuit, and will therefore reduce the voltage on the collector electrode of the transistor 38 toward the balanced condition. Over a period of time, the capacitor 48 will become sufficiently charged to bring the collector of the transistor 38 to its balanced condition. When the collector of the transistor 38 reaches and passes through this balanced condition, it will become more negative than it would be if the differential amplifier were balanced, and this negative condition will in turn result in the output of the DTL gate 42 switching to ground and discharging the capacitor 48 a small amount during each of the clock pulses which make the field effect transistor 44 conductive. As the charge level on the capacitor 48 becomes more negative, the field effect transistor 50 becomes less conductive, and less current is allowed to flow from the emitter of the transistor 38 to ground, thereby increasing the conductivity of the transistor 38, and making the voltage level on the collector of the transistor 38 more positive.

The circuit, therefore, during the clock pulse periods, functions as a closed loop feedback system, the field effect transistor 50 draining current from the emitter of the transistor 38 in different amounts, and thereby lowering the potential on the collector of the transistor 38 if that potential is higher than it should be for a balanced gain differential amplifier, and raising the potential on the collector of the transistor 38 if that potential is too low.

It will be appreciated that the amount of current which will flow through the field effect transistor 50 is not cycled on and off by the clock pulse at point 28, but is dependent only on the voltage level of the capacitor 48, which capacitor is raised and lowered in potential level during each clock pulse period. Therefore, the correction which is introduced during the clock pulse periods to balance the differential amplifier will remain during those periods when the clock pulse wave train at point 28 is at its quiescent level, and the differential amplifier is responsive to the inputs at points 14 and 16. Therefore, the differential amplifier may be used for comparing these input signals at points 14 and 16 during these quiescent periods of the clock signal at point 28, and the amplifier will be checked and balanced at the frequency of the clock pulse waveforms, which in this preferred embodiment is 120 times per second.

Since, as explained above, a small amount of charge is added to or subtracted from the capacitor 48 during each period of the clock 28, it will be understood that if the gain of either of the amplifying elements 102 or 104 changes a substantial amount over a short period of time, the differential amplifier 100 will not be balanced until numerous periods of the clock 28 have transpired. This will likewise be the case when the differential amplifier 100 is initially connected to the power supplies 32 and 33, since the capacitor will have no initial charge. However, if the gain of one of the differential amplifier elements 102 or 104 changes slowly, or if these gains remain constant, the small charge added to or subtracted from the capacitor 48 during each clock period will be sufficient to drive the differential amplifier through the balanced condition so that the DTL gate will produce its alternative output after only one period of the clock 28. Thus, if the gain of the differential amplifier elements 102 or 104 remains constant, the output of the DTL logic gate 42 will toggle between the positive and zero output levels during each succeeding period of the clock 28 and the charge level of the capacitor 48 will oscillate about the balanced level at a frequency corresponding to one-half the frequency of the clock 28.

An output point 52, as shown in FIG. 1 may be derived from the output of the gate 42, such that, when the clock waveform at point 28 is at its quiescent level, the output at point 52 will be indicative of the relative polarity of the voltages at input points 14 and 16, i.e., if the voltage at point 14 at a given instant is more positive than the voltage at point 16, the potential at the gate electrode of the field effect transistor 40 will become more positive than the balanced level, which in turn will clamp the input to the gate 42 to a zero voltage level and thereby produce a positive voltage output at point 52. If, on the other hand, the potential at point 16, at a given instant, is more positive than the potential at point 14, the potential at the gate electrode of the field effect transistor 40 will become more negative than the balanced level, causing the drain electrode of field effect transistor 40 to become more positive, and DTL gate 42 to produce a grounded output.

A high frequency filter circuit may be added to the differential amplifier, such as the capacitor 54 which is connected between the drain of the field effect transistor 10 and ground, to filter high frequency power supply interference from the differential amplifier circuit.

A resistor 56, in conjunction with the resistor 34, form a biasing network for the transistor 38.

What is claimed is:

1. A circuit for periodically balancing the amplifying elements of a differential amplifier, comprising:

means for periodically inducing predetermined signal levels on the inputs of each of said amplifying elements;

means responsive to said periodically inducing means and an output of said differential amplifier for sensing an imbalance between said amplifying elements while said predetermined signal levels are induced on said inputs;

means responsive to said sensing means for changing the gain of said differential amplifier to correct for said imbalance; and means for maintaining the corrected gain of said differential amplifier during the periods between successive operations of said periodically inducing means.

2. The circuit defined in claim 1 wherein said maintaining means comprises:

means for averaging the output signal of said gain changing means over a period greater than the period of said periodically inducing means, and means for regulating the gain of said one of said amplifying elements in accordance with the output of said averaging means.

3. The circuit defined in claim 2 wherein said means for averaging the output signal comprises a capacitor charged by the output of said gain changing means through a resistor.

4. The circuit defined in claim 3 wherein said regulating means comprises a transistor connected to limit the current through one of said amplifying elements in response to the charge level of said capacitor.

5. The circuit defined in claim 1 wherein said predetermined signal level is zero volts, and wherein said periodically inducing means induces ground potentials on the inputs of each of said amplifying elements.

6. A circuit for periodically balancing the amplifying elements of a differential amplifier, comprising:

an energy storage device;

means for periodically altering the energy level of said energy storage device in accordance with the imbalance of said amplifying elements; and means connected to the output of one of said amplifying elements for limiting the output current of said one of said amplifying elements in response to the energy level of said energy storage device.

7. The circuit defined in claim 6 wherein said altering means comprises:

means for periodically inducing predetermined signals upon the inputs of each of said amplifying elements, and means for changing said energy level in accordance with said imbalance only during said periodic inducing.

8. The circuit defined in claim 7 wherein said predetermined signals are equal.

9. The circuit defined in claim 7 wherein said energy level altering means introduces only a predetermined change in said energy level during any one period of said periodically inducing means, said predetermined change being insufficient to correct for large circuit imbalances.

10. A circuit for periodically correcting the imbalance of a differential amplifier which includes amplifying elements the amplification characteristics of which may vary by a substantial amount, such as field effect transistors, comprising:

means for periodically monitoring circuit imbalance; and means responsive to said monitoring means for automatically correcting said circuit imbalance, said correcting means introducing a predetermined amount of correction for said circuit imbalance during each period of said periodically monitoring means, said predetermined amount being insufficient to correct for large circuit imbalances.

11. A method of correcting imbalance between the amplifying elements of a differential amplifier, at least one of said amplifying elements having a variable impedance in series with its output, comprising:

producing a periodic clock signal;

sensing said imbalance once during each period of said periodic clock signal to produce a signal representative of said imbalance; and altering said impedance in the output of said one of said amplifying elements in response to said representative signal.

12. The method defined in claim 11 wherein said sensing step comprises:

inducing a predetermined signal on the inputs of said amplifying elements once during each period of said periodic clock pulse; and sensing imbalance of said amplifying elements during the times when said predetermined signal is induced on said inputs.

13. A circuit for correcting the imbalance of a differential amplifier, comprising:

a clocking circuit for producing a periodic output signal;

means responsive to said clocking circuit for periodically grounding the inputs to said differential amplifier;

a voltage sensing circuit responsive to an output of said differential amplifier for producing an output signal representative of the imbalance of said differential amplifier;

a capacitor;

means responsive to said output of said clocking circuit and said output of said voltage sensing circuit for charging or discharging said capacitor in accordance with said output of said voltage sensing circuit only when said periodically grounding means is grounding said inputs; and means for altering the gain of said differential amplifier in accordance with the charge on said capacitor.

14. A circuit for maintaining the amplifying elements of a differential amplifier in a balanced condition, comprising:

means for maintaining a reference signal;

means connected to the output of one of said amplifying elements for limiting the output current of said one of said amplifying elements in accordance with said reference signal;

means for measuring the imbalance of said differential amplifier; and means of resetting said reference signal periodicially in response to said measuring means.

15. A circuit as defined in claim 14 wherein said maintaining means comprises a capacitor, and wherein said means for resetting charges or discharges said capacitor with a limited current for a limited length of time.

16. A circuit defined in claim 15 wherein said current limiting means comprises:

a semiconductor, the impedance of which is responsive to the charge on said capacitor, said semiconductor series connected with said output of said one of said amplifying elements.

* * * * *